US012787459B2

(12) United States Patent
Wang et al.

(10) Patent No.: US 12,787,459 B2
(45) Date of Patent: Nov. 3, 2026

(54) SILICON CARBIDE OPTO-THYRISTOR AND METHOD FOR MANUFACTURING THE SAME

(71) Applicant: Taiwan-Asia Semiconductor Corporation, Hsinchu City (TW)

(72) Inventors: Di-Bao Wang, Hsinchu City (TW); Wen-Chung Lee, Hsinchu City (TW)

(73) Assignee: TAIWAN-ASIA SEMICONDUCTOR CORPORATION, Hsinchu City (TW)

( * ) Notice: Subject to any disclaimer, the term of this patent is extended or adjusted under 35 U.S.C. 154(b) by 398 days.

(21) Appl. No.: 18/483,624

(22) Filed: Oct. 10, 2023

(65) Prior Publication Data

US 2024/0145613 A1 May 2, 2024

(30) Foreign Application Priority Data

Nov. 2, 2022 (TW) ................................. 111141906

(51) Int. Cl.
*H10F 30/26* (2025.01)
*H10D 8/80* (2025.01)
*H10D 62/832* (2025.01)
*H10P 14/20* (2026.01)

(52) U.S. Cl.
CPC ............. *H10F 30/263* (2025.01); *H10D 8/80* (2025.01); *H10D 62/8325* (2025.01); *H10P 14/2904* (2026.01); *H10P 14/3408* (2026.01)

(58) Field of Classification Search
CPC .... H10F 30/263; H10D 8/80; H10D 62/8325; H10P 14/2904; H10P 14/3408
See application file for complete search history.

(56) References Cited

U.S. PATENT DOCUMENTS

| | | | | |
|---|---|---|---|---|
| 7,135,359 | B2 | 11/2006 | Agarwal et al. | |
| 2005/0045908 | A1 * | 3/2005 | Nakajima | H10F 30/263 257/113 |
| 2007/0001176 | A1 | 1/2007 | Ward, III et al. | |
| 2010/0314629 | A1 | 12/2010 | Tarui et al. | |
| 2012/0061730 | A1 * | 3/2012 | Yamanaka | H10D 10/021 257/E29.171 |
| 2012/0214275 | A1 | 8/2012 | Mazzola | |
| 2020/0105961 | A1 * | 4/2020 | Boone | A61N 1/36125 |

* cited by examiner

*Primary Examiner* — Marc-Anthony Armand
(74) *Attorney, Agent, or Firm* — MUNCY, GEISSLER, OLDS & LOWE, P.C.

(57) ABSTRACT

The present disclosure provides a silicon carbide (SiC) opto-thyristor and a method for manufacturing the same. The SiC opto-thyristor includes a SiC substrate, a SiC light emitter and a SiC light-sensitive thyristor. In the method, a SiC epitaxy is mainly formed on the SiC substrate with the doped P-type and N-type semiconductor materials to define the regions for forming the SiC light emitter and the basic structures of the SiC light-sensitive thyristor. A passivation layer is deposited. Conducting channels for the SiC light emitter and the SiC light-sensitive thyristor are formed by an etching process. After patterning a metal conductor layer, a structure of electrical contacts of the SiC light emitter and the SiC light-sensitive thyristor is formed. Then, terminals of an input voltage and an output voltage of the silicon carbide opto-thyristor are formed after a wire bonding process upon the electrical contacts. Finally, a packaging process is performed.

6 Claims, 11 Drawing Sheets

SILICON CARBIDE OPTO-THYRISTOR AND METHOD FOR MANUFACTURING THE SAME

CROSS-REFERENCES TO RELATED APPLICATIONS

This application claims priority to Taiwan Patent Application No. 111141906 filed on Nov. 2, 2022, which is hereby incorporated by reference in its entirety.

BACKGROUND OF THE INVENTION

Field of the Invention

The present disclosure relates to an application of a thyristor, especially a silicon carbide (SiC) opto-thyristor with a light-emitting diode and a light-sensitive thyristor formed therein together through a semiconductor process, and a method for manufacturing the same.

Descriptions of the Related Art

A conventional thyristor is a semiconductor device with four layers of alternating P/N layers, implemented as a silicon-controlled rectifier. General silicon-controlled rectifiers have three terminals (i.e., the anode, cathode and gate), in which current or voltage signal can pass through the gate to control the conduction of the anode and cathode, as a switch.

In a typical opto-thyristor (phototriac or opto-triac) such as a light-controlled three-terminal bidirectional AC (triac) switch, to separate the high and low voltage areas in the circuit, the high and low voltage areas are electrically isolated, and the power density of the high voltage alternating current (AC) load can be controlled by the light signals emitted from the light-emitting diodes (LEDs) driven by the periodic low voltage.

FIG. 1 shows a schematic view of an opto-thyristor. The left side belongs to the low voltage area, and is provided with a light-emitting diode 11. The current is input through the two terminals 101 and 102 of the input voltage Vin, causing the light-emitting diode 11 to emit light. The thyristor 13 receives the light and controls the gate 105, and the thyristor 13 is triggered to conduct the anode and the cathode (103, 104), allowing the terminals 103, 104 of the output voltage Vout to output voltage to the load (high voltage area).

A common silicon-based opto-thyristor consists of two chips, i.e., a light-emitting diode (LED) and a thyristor. Small horizontal AC loads have an upper withstand voltage limit of 600-800 volts, while large vertical AC loads have an upper withstand voltage limit of 2,000-8,000 volts.

However, to implement an opto-thyristor, two chips are required to be the transmitter (TX) and receiver (RX), respectively, where the transmitter (e.g., using an LED) generates a light signal, and the receiver receives the light signal to control the current flowing into the thyristor. Two processes are required to manufacture the above two chips for the receiver and the transmitter. In addition, the withstand voltage of the output of the traditional small silicon-based horizontal opto-thyristor is limited to 800-900V at most.

SUMMARY OF THE INVENTION

The present disclosure proposes a SiC opto-thyristor with a light-emitting diode and a light-sensitive thyristor formed therein through a semiconductor process and a method for manufacturing the same.

The main structure of the SiC opto-thyristor includes a SiC substrate, a SiC light emitter formed on the SiC substrate, and a SiC light-sensitive thyristor formed on the SiC substrate. A dielectric material can be provided between the SiC light emitter and the SiC light-sensitive thyristor. The SiC light emitter has a terminal of an input voltage formed by wire bonding, and the SiC light-sensitive thyristor has a terminal of an output voltage by wire bonding.

According to an embodiment of a method for manufacturing a silicon carbide (SiC) opto-thyristor, a SiC substrate is provided first. An epitaxial process is performed to form a SiC epitaxy on the SiC substrate, and then a structure doped with a P-type semiconductor material is formed by implanting the P-type semiconductor material at multiple positions on the SiC epitaxial substrate. Moreover, an N-type semiconductor material is implanted in a part of a structure implanted with the P-type semiconductor material to form one or more P/N junctions to define regions of basic structures for forming a SiC light emitter and a SiC light-sensitive thyristor.

Next, a passivation layer is formed by forming a deposition process. Conducting channels in the passivation layer for the SiC light emitter and the SiC light-sensitive thyristor are formed on the SiC epitaxy and positions doped with P-type semiconductor material and/or the N-type semiconductor material by an etching process. Afterwards, a structure of electrical contacts of the SiC light emitter and the SiC light-sensitive thyristor is formed by a patterning process after forming a metal conductor layer. Terminals of the input voltage and the output voltage of the SiC opto-thyristor are then formed by wire bonding on the electrical contacts of the SiC light emitter and the SiC light-sensitive thyristor. Finally, a packaging process is performed.

Preferably, the SiC epitaxy may be a SiC epitaxy structure formed of an N-type semiconductor material.

Furthermore, in the packaging process, a sealant material is used to seal the SiC light emitter, the SiC light-sensitive thyristor and other semiconductor devices. According to an embodiment, the sealant material is a transparent material for a spectrum between blue light and ultraviolet light so that light emitted by the SiC light emitter travels through the sealant layer and is reflected to the SiC light-sensitive thyristor.

Furthermore, a reflective layer can be coated on any side inside the SiC opto-thyristor packaging structure to increase the photosensitivity of the interior of the SiC photo-thyristor.

Furthermore, the reflective layer can be a reflective layer for wavelength between blue light and ultraviolet light so that the light emitted by the SiC light emitter can travel through a structure of the SiC opto-thyristor having a sealant material or being not filled with the sealant material and toward the SiC light-sensitive thyristor after being reflected by the reflective layer to generate a gate current in the SiC light-sensitive thyristor.

Furthermore, the passivation layer can be made of a transparent passivation layer material for a spectrum of ultraviolet light so that light emitted by the SiC light emitter can travel through an interior of the passivation layer toward the SiC light-sensitive thyristor.

For further understanding of the features and technical content of the present invention, please refer to the following detailed description and drawings related to the present invention. However, the drawings are provided only for reference and description, and are not intended to limit the present invention.

DETAILED DESCRIPTION OF THE PREFERRED EMBODIMENT

The implementation of the present invention is described below through particular embodiments, and those skilled in the art can understand the advantages and effects of the present invention from the content disclosed in this specification. The present invention may be implemented or applied through other different specific embodiments, and various modifications and changes may be made to the details in this specification based on different viewpoints and applications without departing from the concept of the present invention. In addition, it should be noted first that the drawings of the present invention are only for simple illustration, and are not drawn according to the actual size. The following embodiments will further describe the relevant technical content of the present invention in detail, but the disclosed content is not intended to limit the scope of the present invention.

It should be understood that although terms such as "first", "second" and "third" may be used herein to describe various components or signals, these components or signals should not be limited by these terms. These terms are mainly used to distinguish one component from another component, or one signal from another signal. In addition, the term "or" used herein may include any one or a combination of more of the associated listed items depending on the actual situation.

Figure 1:
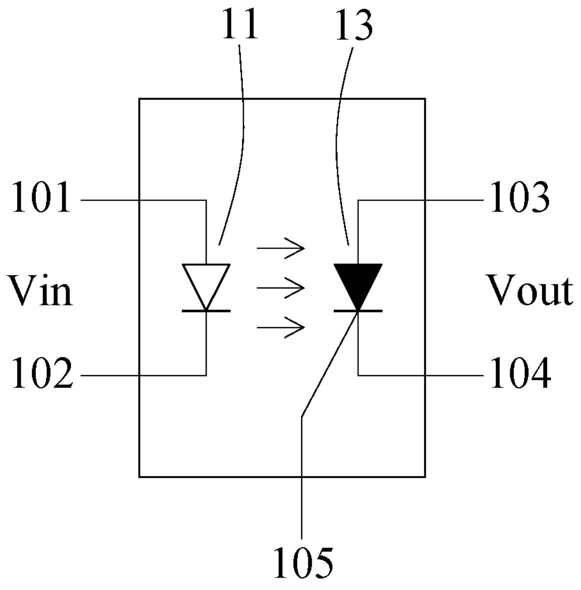
FIG. 1 shows a schematic view of a conventional opto-thyristor.

The conventional opto-thyristor requires two processes to manufacture the transmitter and receiver chips (such as the light-emitting diode 11 and the thyristor 13 shown in FIG. 1) therein, and the silicon-based opto-thyristor has a limited withstand voltage at the output (e.g., withstand voltages of up to 800 to 900 volts merely without additional three-terminal bi-directional AC switches). As a result, the present disclosure proposes a manufacturing method that enables the production of transmitter and receiver components of an opto-thyristor on the same silicon carbide substrate. Therefore, the process can be simplified, achieving the effect of significantly increasing the AC voltage switch's withstand voltage up to several kilovolts without the need for additional components. This also accomplishes the purpose of reducing chip area and simultaneously lowering the costs of associated modules.

Figure 2:
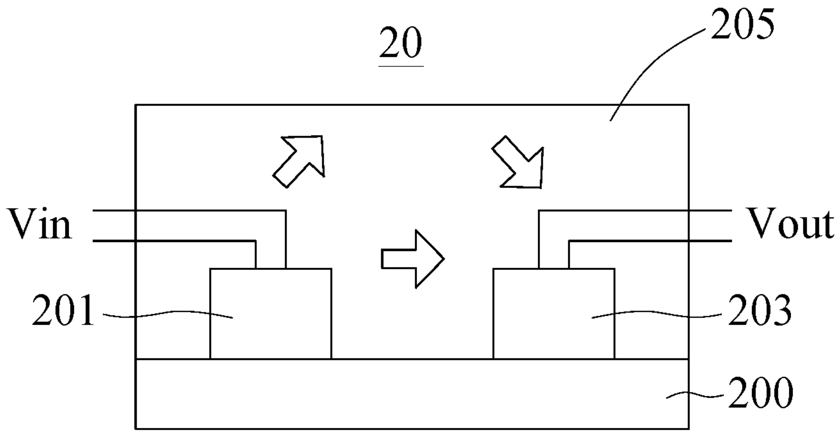
FIG. 2 shows a schematic view of an embodiment of the main structure of a SiC opto-thyristor.

FIG. 2 is a schematic view of an embodiment of the main structure of the SiC opto-thyristor 20 proposed in the present disclosure. The SiC opto-thyristor 20 includes a SiC substrate 200 and does not need to be doped with other materials. In addition, the silicon carbide opto-thyristor 20 includes a SiC light emitter 201, which can be implemented by a SiC light-emitting diode in practice, and may include more than one light emitter, wherein the wavelength of light is preferably about 300-500 nanometers in the spectrum between ultraviolet light and blue light. The SiC opto-thyristor 20 further includes a SiC light-sensitive thyristor 203, which may also include one or more thyristors.

According to an embodiment, the SiC light-sensitive thyristor 203 may be a semiconductor device with four layers of alternating P/N layers, which is used for sensing light and switching the thyristor to conduct current. The structure of SiC opto-thyristor 20 further includes a dielectric material 205 for isolation or coupling between the circuits of the input voltage Vin and the output voltage Vout in the structure of SiC opto-thyristor 20 and covering the SiC light emitter 201 and the SiC light-sensitive thyristor 203. According to one of the embodiments, the dielectric material 205 for isolation or coupling may include $SiO_2$ of undoped polysilicon, and $SiO_2$ may be used for an optical waveguide.

During operation, the SiC light emitter 201 emits light, as shown by the arrow in the figure, traveling in the dielectric material 205 in the structure of the SiC opto-thyristor 20 and toward the SiC light-sensitive thyristor 203. By means of its light-guiding function, the light is guided to the SiC light-sensitive thyristor 203, and the conduction between the anode and the cathode of the SiC light-sensitive thyristor 203 can be controlled in response to the light being sensed.

In particular, the main light-emitting and light-sensitive devices in the SiC opto-thyristor 20 shown in FIG. 2 are made of high breakdown material. For example, the SiC substrate 200, the SiC light emitter 201 and the SiC light-sensitive thyristor 203 disclosed in the above embodiment are made of SiC material. The electric field breakdown strength of SiC is about 10 times that of Si. When the two chips are packaged in an appropriate architecture, the AC withstand voltage is up to 8,000 volts (not taking additional active and passive devices into account).

Figure 3:
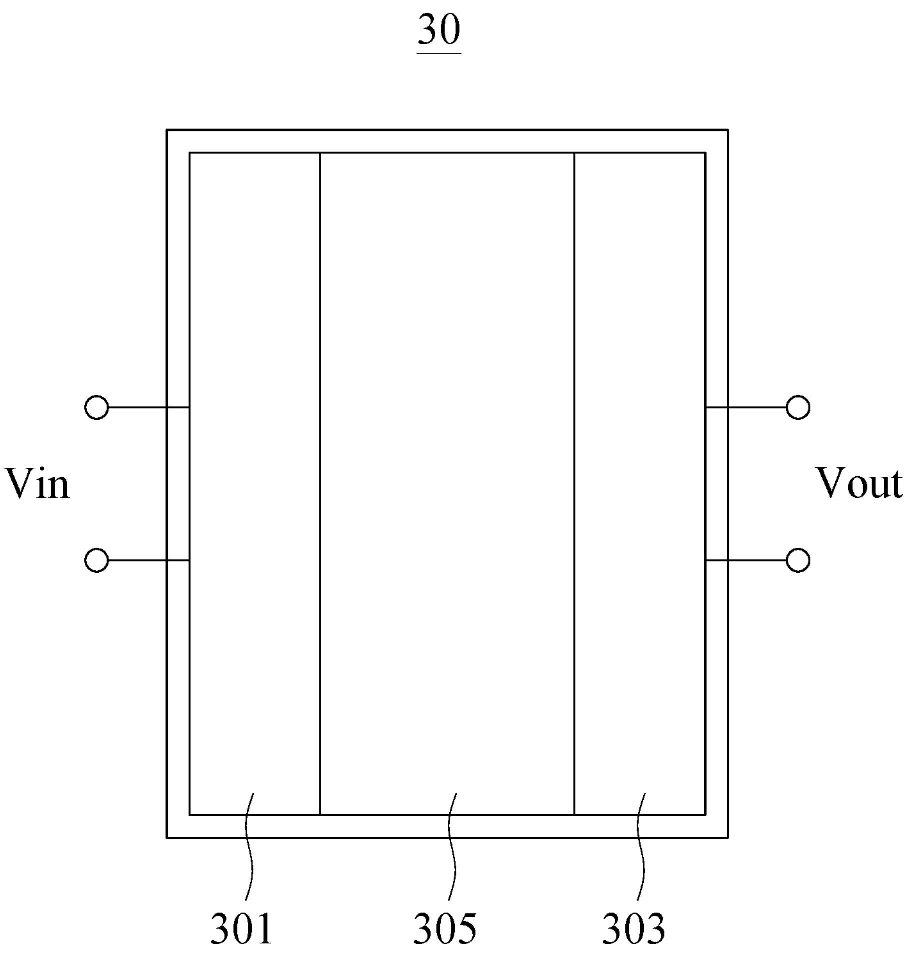
FIG. 3 shows an embodiment of a SiC opto-thyristor.

FIG. 3 shows another embodiment of an equivalent SiC opto-thyristor 30, the main structure of which includes a SiC light emitter 301 at the input voltage Vin end, and the SiC light-sensitive thyristor 303 at the output voltage Vout end. In the embodiment, the SiC light emitter 301 and the SiC light-sensitive thyristor 303 are separated by a dielectric material 305 for isolation or coupling, and can be stacked at one time in the process to form the main three-layer structure shown in the figure.

Figure 4:
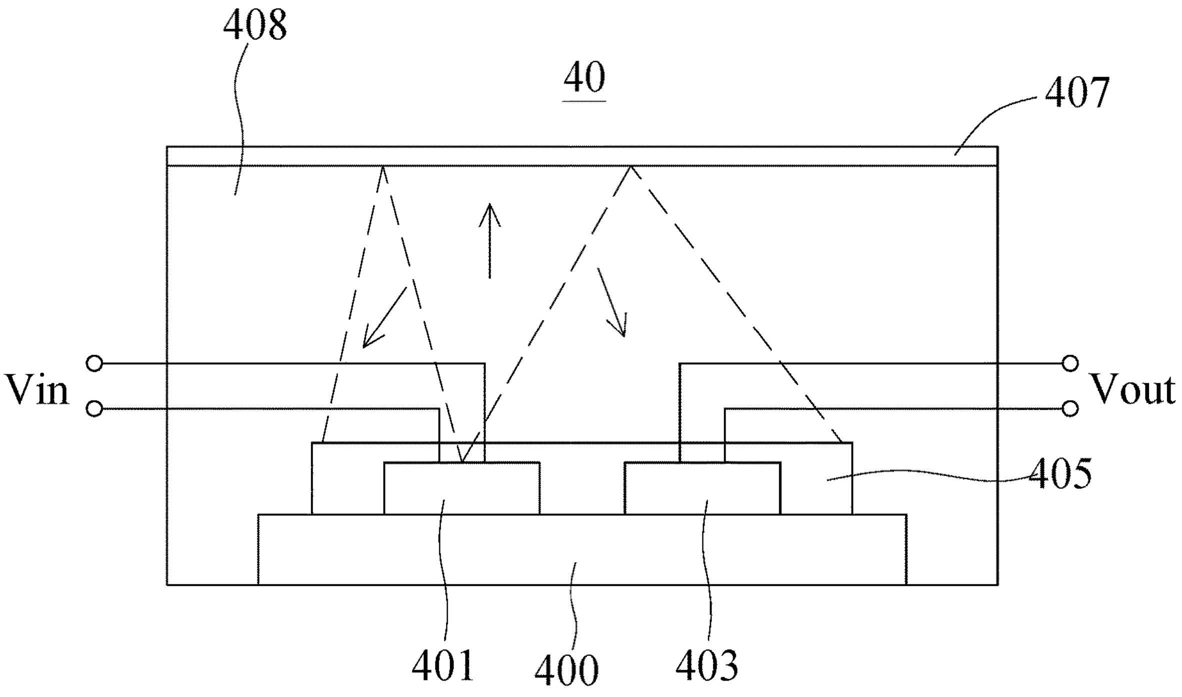
FIG. 4 shows a diagram of a structural embodiment of a SiC opto-thyristor.

Please refer to FIG. 4 for another embodiment, which shows a structural example of the SiC opto-thyristor 40 and the structure of the SiC opto-thyristor 40 shown in the figure includes a package.

The structure of the SiC opto-thyristor 40 shown in FIG. 4 includes a SiC substrate 400 (which also does not need to be doped with other materials), a SiC light emitter 401 provided thereon (which may also be one or more SiC light-emitting diodes), and a SiC light-sensitive thyristor 403 formed together in the process (which can also be one or more light-sensitive thyristors). In the structure of the SiC opto-thyristor 40, the isolation or coupling function between the circuits at both the input voltage Vin end and the output voltage Vout end is provided by the dielectric material 405, which covers the SiC light emitter 401 and the SiC light-sensitive thyristor 403 as shown in the figure. The dielectric material 405 may be $SiO_2$ with undoped polysilicon.

Further, according to the embodiment shown in FIG. 4, a metal reflective layer 407 may be provided on the inner surface of the packaging structure of the SiC opto-thyristor 40 opposite to the other side of the SiC substrate 40. During operation, the SiC light emitter 401 is driven to emit light, and travels within the cavity 408 of the structure of the SiC light emitter 40 (the upward light arrow in the figure) and toward the metal reflective layer 407, and is reflected back to the dielectric material 405 covering the SiC light emitter 401 and the SiC light-sensitive thyristor 403 (the downward light arrow in the figure). By means of the light-guiding function of the dielectric material 405, the light is guided to the SiC light-sensitive thyristor 403. Similarly, the conduction between the anode and the cathode of the SiC light-sensitive thyristor 403 can be controlled according to the generated current in response to the light being sensed. According to another embodiment, the space of the abovementioned cavity 408 may be filled with a sealant material that is transparent to light in a specific spectrum (such as between blue light and ultraviolet light).

Figure 5:
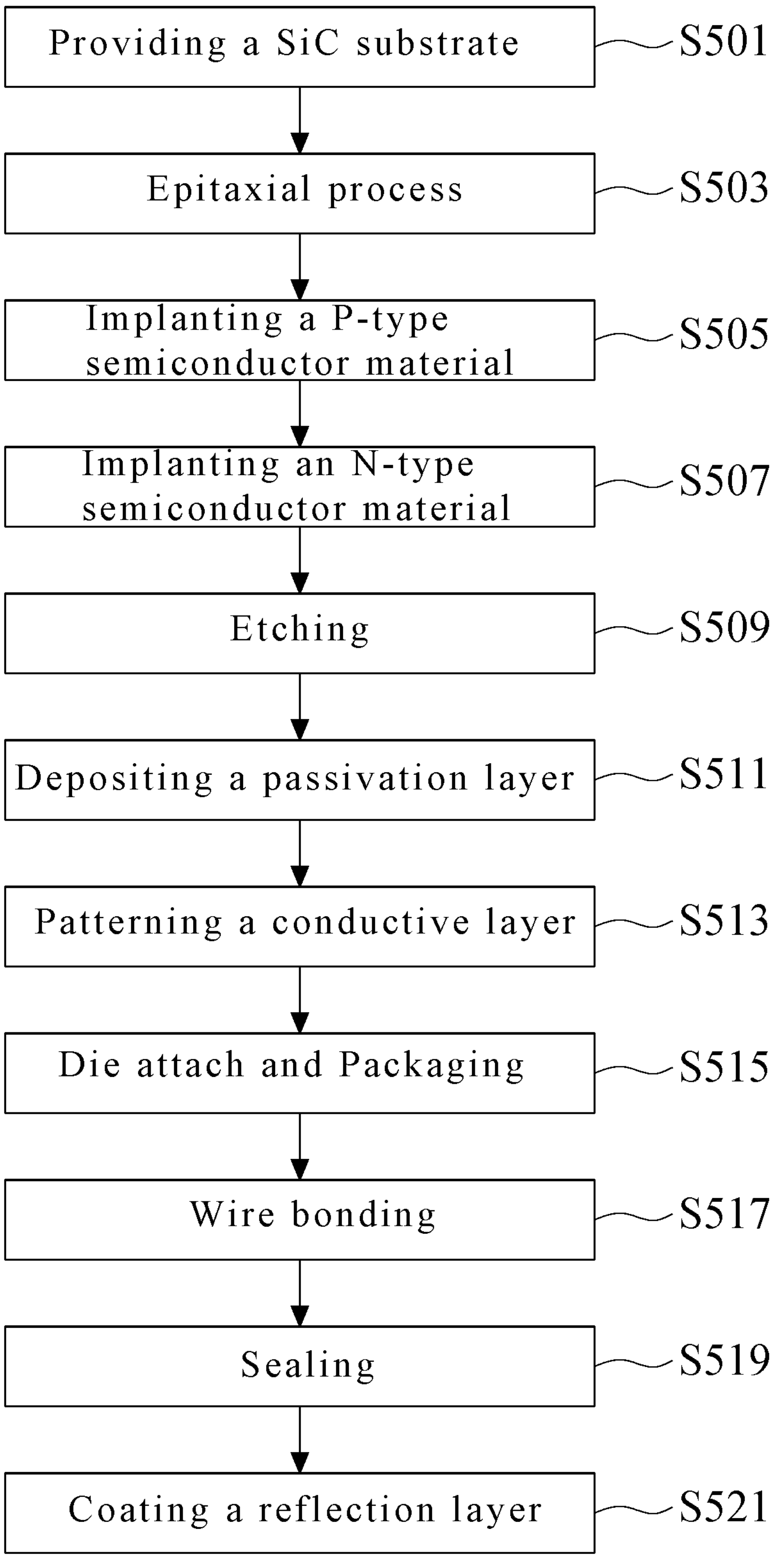
FIG. 5 shows a flowchart of an embodiment of a method for manufacturing a SiC opto-thyristor.

Next, FIG. 5 shows a flowchart of an embodiment of a method for manufacturing the SiC opto-thyristor. The structure formed by this process can refer to the implementation examples shown in FIGS. 8 to 11 in the present disclosure.

According to the embodiment of the process shown in FIG. 5, a SiC substrate is provided first (Step S501). As described in the above embodiments, the SiC substrate does not need to be doped with other materials. Next, an epitaxial process (i.e., epitaxial growth) is performed (Step S503) to generate a SiC epitaxy on the SiC substrate through the epitaxial process, preferably a SiC epitaxial structure formed of an N-type semiconductor material (called an N-type epitaxial layer) to construct semiconductor devices on this SiC epitaxial substrate by one of the methods such as deposition of a conductive single crystalline layer. Next, in order to construct a device with semiconductor characteristics, a P-type semiconductor material can be implanted in multiple positions of the SiC epitaxy according to requirements to form a structure doped with a P-type semiconductor material in multiple positions (Step S505). Likewise, an N-type semiconductor material can be implanted in the parts implanted with the P-type semiconductor material to form a structure doped with an N-type semiconductor material so as to form one or more P-N junctions between the P-type semiconductor material and N-type semiconductor material (Step S507), and further define the regions for forming the SiC light emitter and the basic structure (P/N/P/N structure) of the SiC light-sensitive thyristor, thereby forming the semiconductor diode, that is, the basis for simultaneously forming the SiC light emitter with light-emitting diode characteristics and the SiC light-sensitive thyristor in one process. The above steps S505 and S507 can be repeated one or more times as required.

Next, after depositing a passivation layer, conducting channels in the passivation layer for two devices, such as the SiC light emitter and the SiC light-sensitive thyristor, are formed on the SiC epitaxy and positions doped with P-type semiconductor material and/or the N-type semiconductor material by the process of etching the passivation layer (Step S509). The objective is to separate the high and low voltage structures in a semiconductor structure, that is, to form multiple fundamental structures that serve as input and output conductive electrodes or the ground. Subsequently, deposition of the passivation layer can be continued on the etched structure. The material of the passivation layer may be $SiO_2$ or $Si_3N_4$ to form an insulating protective layer, or the passivation layer can be deposited first and then the insulating protective layer can be formed by etching (Step S511). Next, a metal conductor layer is formed, and then a conductive layer for electrical contacts of the SiC light emitter and the SiC light-sensitive thyristor is formed by a patterning process (Step S513).

Then, the packaging process including die attach (Step S515), and wire bonding on the electrical contacts of the SiC light emitter and the SiC light-sensitive thyristor to form the terminals of the input voltage and the output voltage of the SiC opto-thyristor (Step S517) are carried out. In the packaging process, the final step is sealing. For example, epoxy resin and other sealant materials can be used to seal the abovementioned semiconductor devices mainly including the SiC light emitter and the SiC light-sensitive thyristor (Step S519). In an embodiment, the sealant material may be a material that is transparent to light in a specific spectrum (such as a spectrum of ultraviolet light). In another embodiment, the design of the cavity may be adopted in the sealant layer, except for air or vacuum without other materials being filled. Afterwards, according to the requirements of specific embodiments, a reflective layer can be coated on one part of the SiC opto-thyristor structure, such as a reflection layer for light in a spectrum between blue light and ultraviolet light, to increase the photosensitivity of the interior of the SiC opto-thyristor (Step S521).

The light-emitting and light-receiving devices required for SiC opto-thyristors are formed on a single SiC substrate through the above simplified process embodiment, which can effectively reduce the cost of the process, packaging and final module formation.

Figure 6:
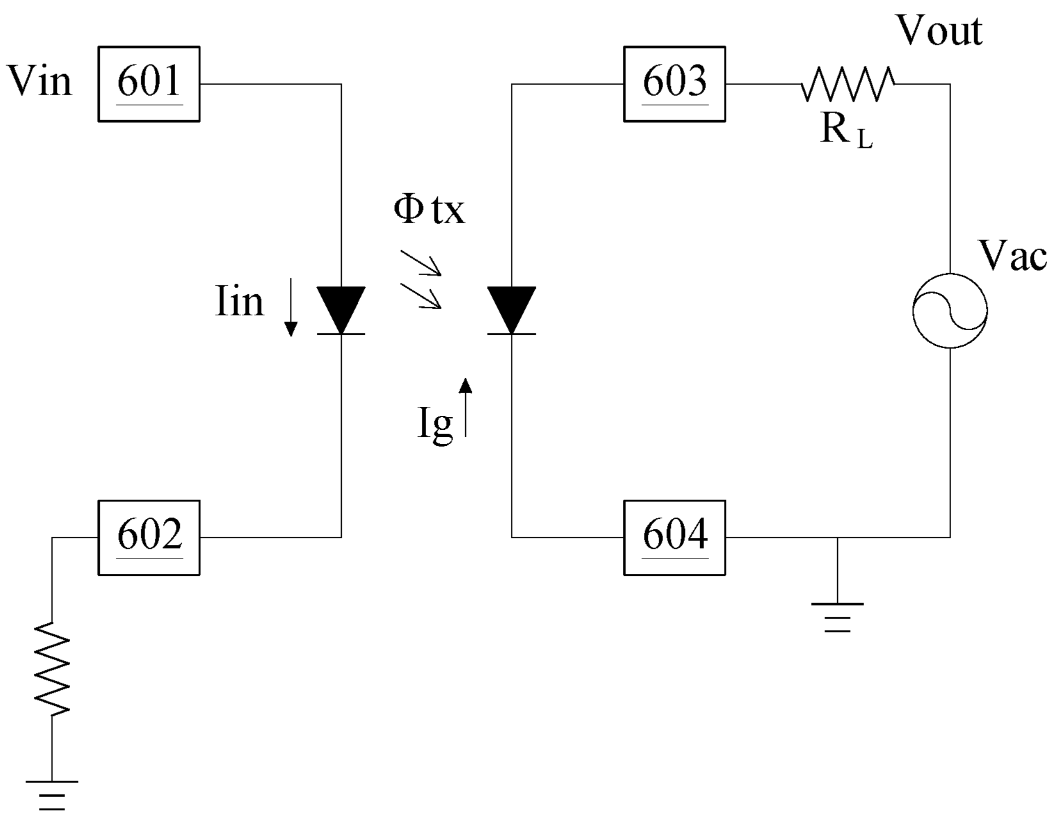
FIG. 6 shows a schematic view of an embodiment of an equivalent circuit of a SiC opto-thyristor and its AC loading.
Figure 7:
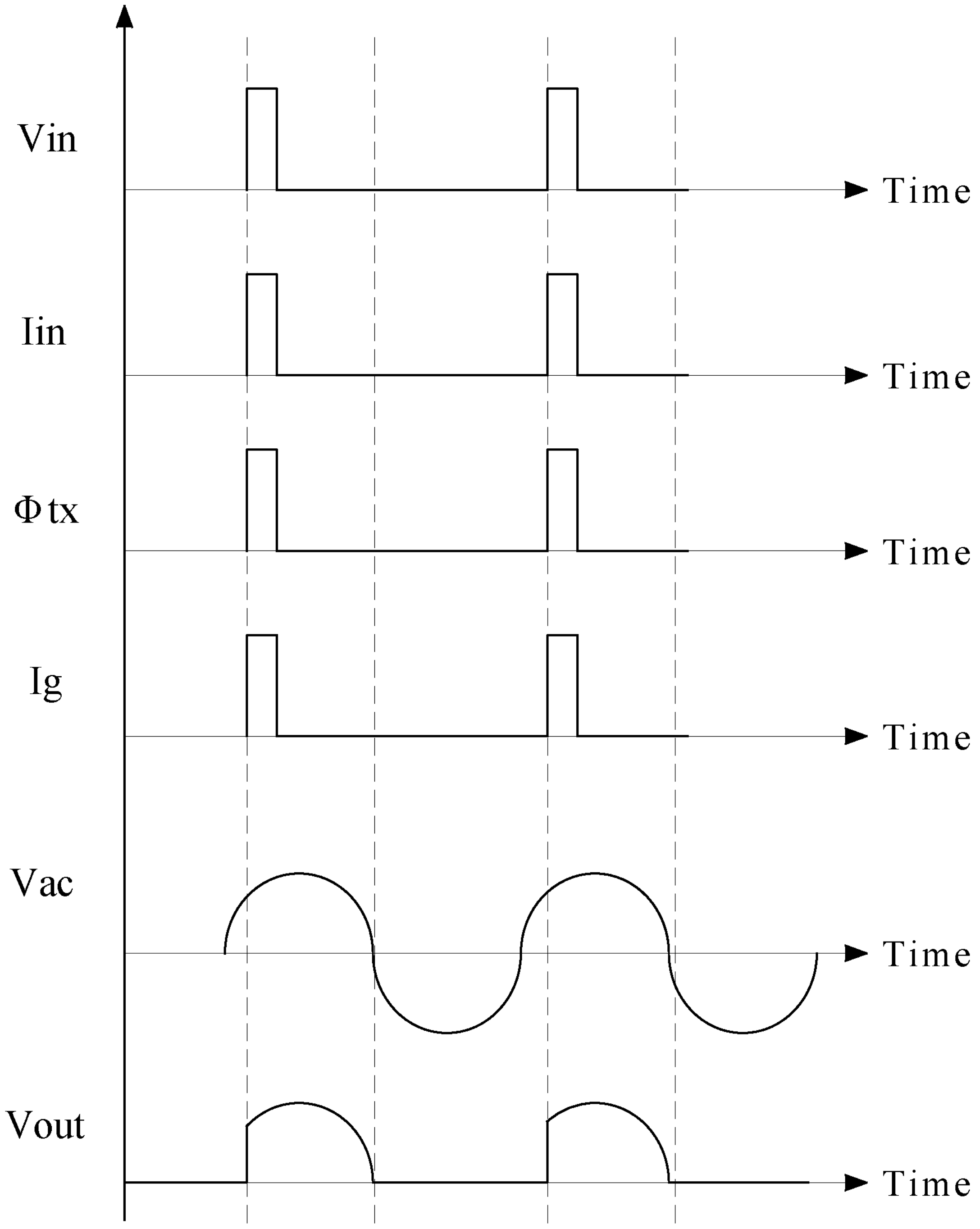
FIG. 7 shows an example diagram of the operation timing of the SiC opto-thyristor.

The schematic circuit view of the SiC opto-thyristor can be referred to FIG. 6, and the timing diagram of each device can be referred to FIG. 7. In FIG. 6, the input voltage Vin is the driving voltage of the SiC opto-thyristor (e.g., a DC power supply of 3 to 10 volts), which is introduced into the SiC opto-thyristor shown in the figure through the input terminals 601 and 602 (ground) to generate the driving current tin of the light-emitting diode (e.g., a current of about 0.5 to 10 milliamps (mA)). At this time, a few milliwatts of luminous flux (Optical flux) Φtx can be generated on the light-emitting diode. The light is directed toward the light-sensitive thyristor to generate a gate current Ig, which can conduct the light-sensitive thyristor under a certain condition so that the output voltage Vout is generated at the output terminals 603 and 604 through the load RL.

According to the embodiment shown in FIG. 6, the operation timing of the gate current Ig follows the timing of the input voltage Vin of the inputs 601 and 602 of the SiC light emitter shown in FIG. 7 and works according to the timing of the driving current tin flowing through the light-emitting diode and the timing of leading to the luminous flux Φtx. This example shows that the output 603 and 604 of the SiC light-sensitive thyristor are connected to the AC power supply Vac (the output timing of the AC power supply Vac is shown in FIG. 7). However, with the conduction time of the outputs 603 and 604 controlled by the gate current Ig generated by the SiC light-sensitive thyristor (i.e., the function of the thyristor switch is applied to the AC power supply Vac), the cut-off signal can be generated for the AC power supply Vac.

According to the embodiments, the SiC opto-thyristor shown in FIG. 6 can operate as a kind of silicon-controlled rectifier. When the silicon-controlled rectifier is in operation, the input voltage Vin input to the SiC light emitter determines the light-emitting timing of the light-emitting diode therein and leads to the luminous flux Φtx in the diode of the SiC light-sensitive thyristor so as to generate the cut-off signal for the AC power supply Vac. According to the schematic timing diagram shown in FIG. 7, when the silicon-controlled rectifier is in the positive half circle of the output voltage signal of the AC power supply Vac, the gate current Ig of the SiC light-sensitive thyristor conducts the outputs 603 and 604 of the silicon carbide thyristor to generate the output voltage Vout corresponding to the positive half-cycle signal of the AC power supply Vac shown in FIG. 7. On the contrary, when in the positive half circle of the output voltage signal of the AC power supply Vac, the outputs 603 and 604 of the SiC light-sensitive thyristor are not conducted, which is treated as the cut-off signal of the AC power supply Vac, to generate the output voltage Vout shown in FIG. 7 in which the negative half-cycle signal of the AC power supply Vac is cut off.

First Embodiment

Figure 8:
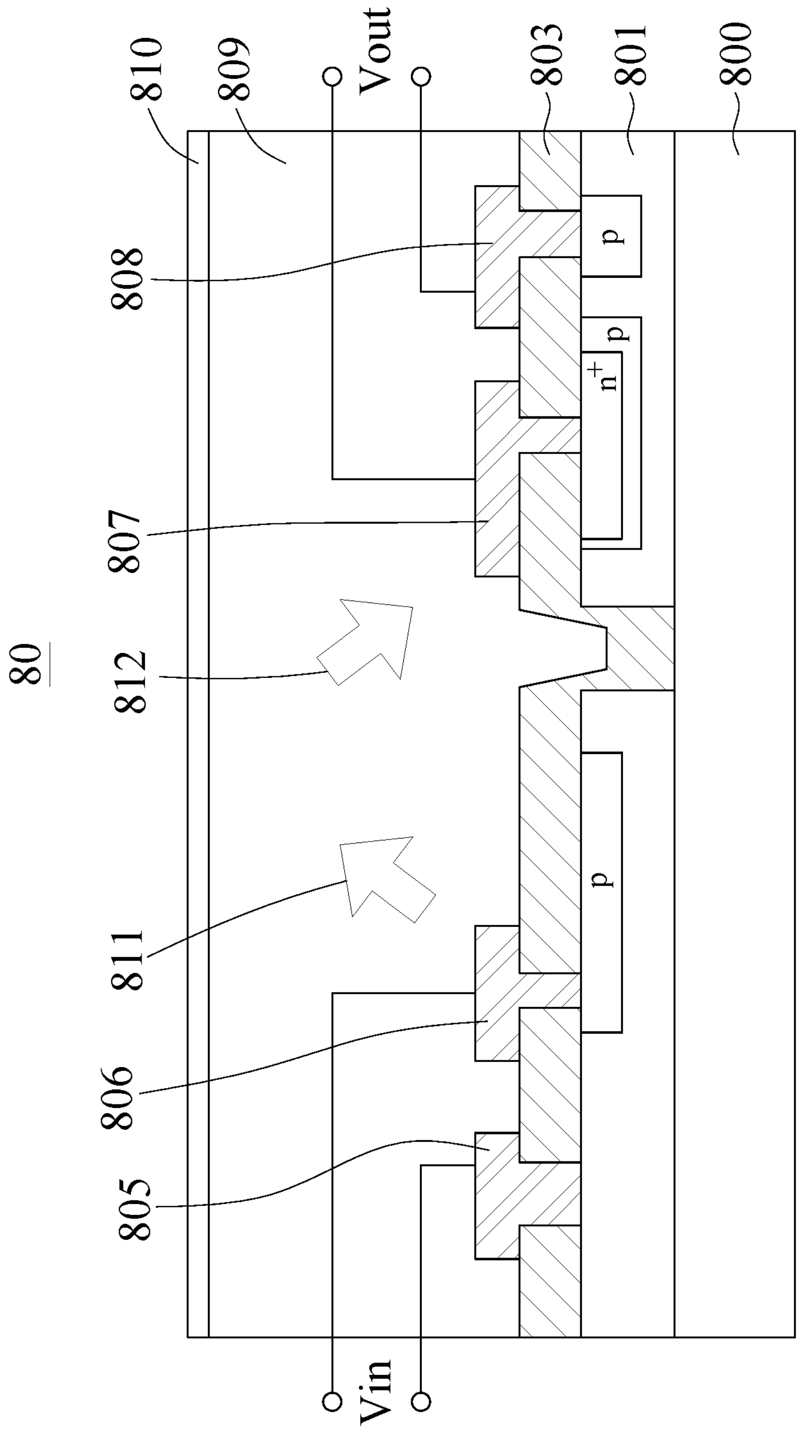
FIG. 8 shows a schematic view of a cross-sectional structure of the first embodiment of the SiC opto-thyristor proposed in the present disclosure.

FIG. 8 shows a schematic cross-sectional structure diagram of the first embodiment of the SiC opto-thyristor proposed in the present disclosure.

The figure shows that the SiC opto-thyristor 80 has a SiC substrate 800 and the semiconductor devices, i.e., a SiC light emitter and a SiC light-sensitive thyristor, formed on the SiC substrate 800 through the process shown in FIG. 8, in which the P-N structure on the left forms the SiC light emitter, and the P-N-P-N thyristor structure on the right forms the SiC photosensitive thyristor. The SiC epitaxial layer 801 can be formed first by the epitaxial process, which can be N-type epitaxial. The SiC light emitter and the basic structure of the SiC light-sensitive thyristor are formed by doping semiconductor materials, wherein a part of P/N junctions formed by P-type dopant and N-type epitaxy constitutes the SiC light emitter. Next, a passivation layer 803 is formed as insulation. After etching, conducting channels for conductive structures are formed. Then, a conductive layer is formed by deposition, and metal conductive structures 805, 806, 807 and 808 are formed by a patterning process.

Next, the terminals for the input voltage Vin and the output voltage Vout of the SiC opto-thyristor 80 are formed by wire bonding on the electrical contacts of the SiC light emitter and the SiC light-sensitive thyristor of the SiC opto-thyristor 80. Afterwards, the sealant layer 809 is formed by sealing in the cavity. In this example, the reflective layer 810 can be formed on the upper surface of the sealant layer 809 corresponding to the structure of the SiC light emitter and the SiC light-sensitive thyristor. The material of the reflective layer 810 may be aluminum coated on the surface of the device or a material modified by expanded polytetrafluoroethylene (e-PTFE). According to an embodiment, the material of the sealant layer 809 is preferably a transparent material for a spectrum between blue light and ultraviolet light (e.g., UV-transparent molding compound). In another embodiment, the structure of the sealant layer 809 may be a cavity structure only without filling any material except air or vacuum.

According to the embodiment of the structure of the SiC opto-thyristor 80 shown in FIG. 8, the light (in the spectrum of ultraviolet light) formed by SiC light emitter as shown by the arrow 811, travels within the structure having a sealant material (for forming a sealant layer) or not being filled with a sealant material (cavity structure), is reflected by the reflective layer 810 as shown by the arrow 812, and travels toward the SiC light-sensitive thyristor to generate the gate current Ig in the SiC light-sensitive thyristor.

Second Embodiment

Figure 9:
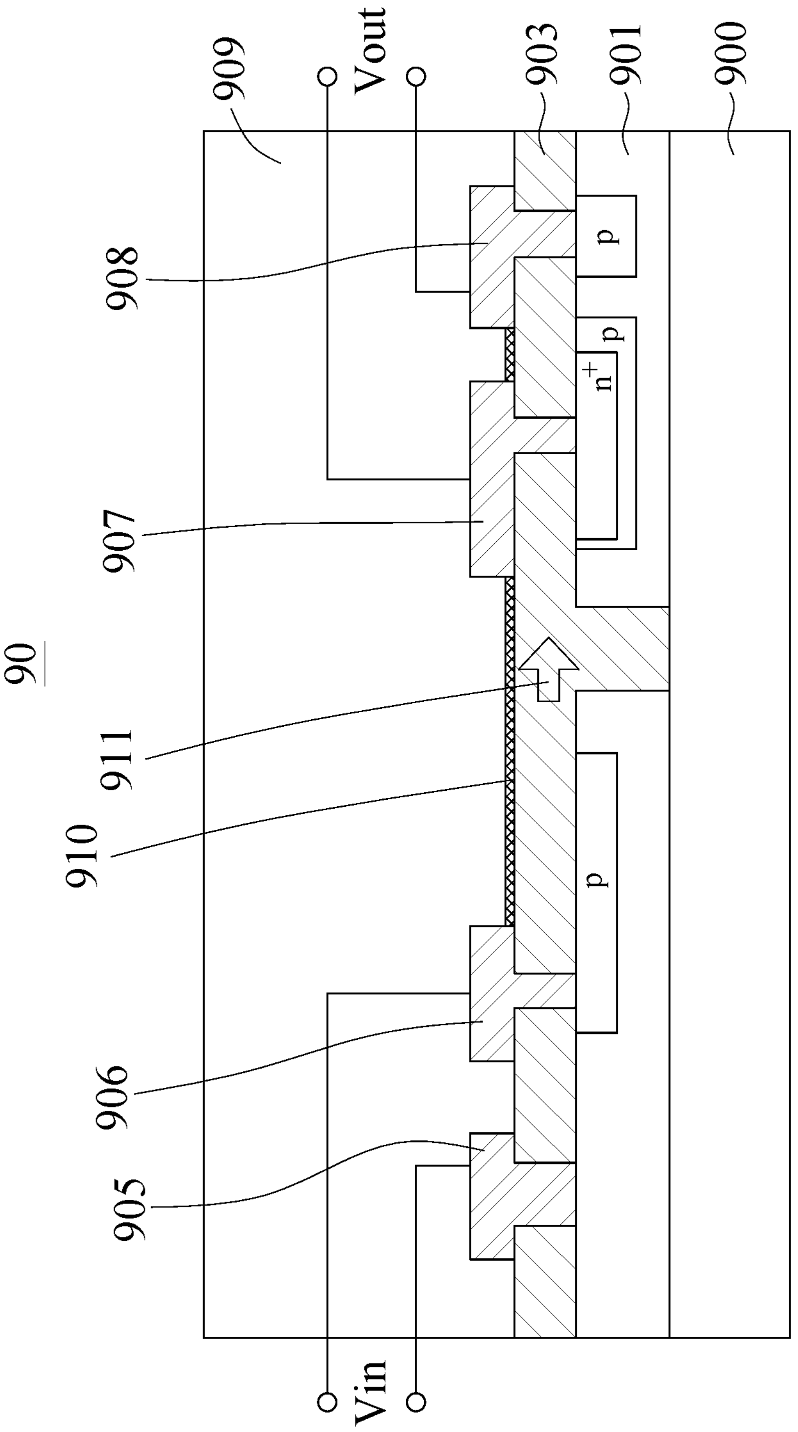
FIG. 9 shows a schematic view of a cross-sectional structure of the second embodiment of the SiC opto-thyristor proposed in the present disclosure.

FIG. 9 shows another embodiment of the structure of a SiC opto-thyristor 90. The fabrication process of the SiC opto-thyristor 90 is as described in FIG. 5. The main structures include a SiC substrate 900, a SiC epitaxial layer 901, a passivation layer 903 for forming a conductive metal layer after an etching process, metal conductive structures 905, 906, 907, 908 formed by a patterning process, as well as other structures, i.e., the sealant layer 909 which is transparent to the light in the spectrum between blue light and ultraviolet light, and the reflective layer 910. In this example, the reflective layer 910 may be a reflective layer for light in the spectrum between blue light and ultraviolet light, and may be formed in a coating manner on one or more areas on the upper surface of the passivation layer 903.

In particular, in this example, the SiC epitaxial layer 901 is cut into two parts by a dry etching process during the process, thereby defining the input and the output of the SiC opto-thyristor 90. Similarly, during the manufacturing process, wire bonding is performed on the defined metal conductive structures 905, 906, 907 and 908 of the SiC light emitter and the SiC light-sensitive thyristor to form the terminals of the input voltage Vin and the output voltage Vout, respectively.

In particular, in this embodiment, no reflective structure is formed on the side surface corresponding to the SiC light emitter and the SiC light-sensitive thyristor. However, when passivation layer 903 is formed, a passivation layer material that is transparent to the light in a specific spectrum (e.g., a spectrum between blue light and ultraviolet light) is used so that the light emitted by the SiC light emitter can travel through the interior of the passivation layer and toward the SiC light-sensitive thyristor as the path of the light shown by the arrow 911. In addition, a reflective layer 910 is used to increase the photosensitivity.

Third Embodiment

Figure 10:
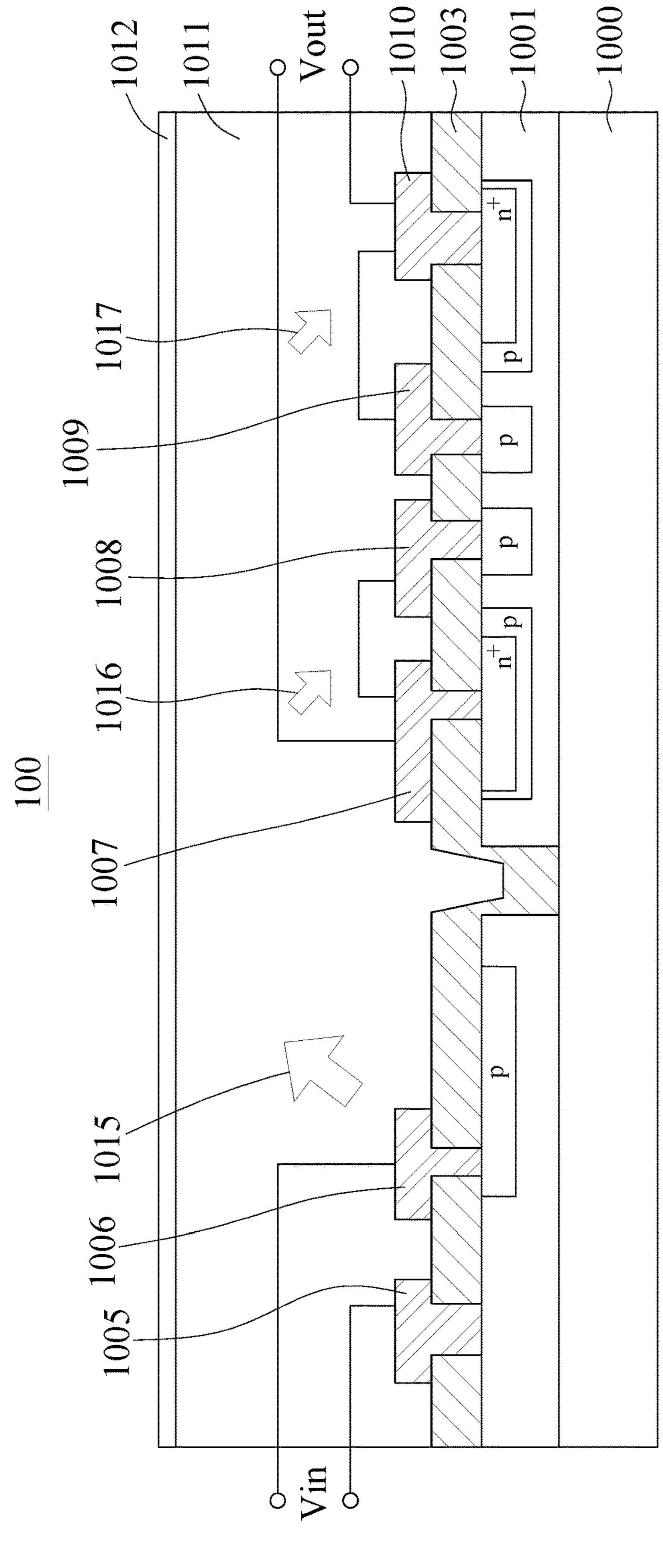
FIG. 10 shows a schematic view of a cross-sectional structure of the third embodiment of the SiC opto-thyristor proposed in the present disclosure.

FIG. 10 shows another embodiment of the structure of a SiC opto-thyristor 100. The main structure includes a SiC substrate 1000, a SiC epitaxial layer 1001, a structure doped with P-type and N-type semiconductor materials, a deposited passivation layer 1003, metal conductive structures 1005, 1006, 1007, 1008, 1009, 1010 defined by a patterning process, the terminals of the input voltage Vin and the output voltage Vout formed by wire bonding as well as other structures including a sealant layer 1011 and a reflective layer 1012. As such, in the figure, the P-N structure on the left forms a SiC light emitter, and the P-N-P-N thyristor structure on the right forms a SiC light-sensitive thyristor.

What is shown in the figure are the structures of the SiC light emitter and the SiC light-sensitive thyristor of the SiC opto-thyristor 100, which are formed in a single SiC process. In particular, the SiC opto-thyristor 100 in this example includes two P-N-P-N thyristor structures. During operation, with the direction of light travel indicated by the arrows 1015, 1016, and 1017 in the figure, the light travels in the sealant layer 1011 (or a cavity structure) that is transparent to light in a specific spectrum (e.g., a spectrum between blue light and ultraviolet light). The light emitted by the SiC light emitter, as shown by the arrow 1015, is directed to the reflective layer 1012 provided on the upper surface of the reflective layer 1011 or the cavity structure, and after reflection, as shown by the arrows 1016 and 1017, it is directed to the two SiC light-sensitive thyristors in the SiC opto-thyristor 100.

Here, it can be appreciated that the SiC opto-thyristor can be defined to have a specific number of SiC light emitters and SiC light-sensitive thyristors by the design of the process according to the requirements.

Fourth Embodiment

Figure 11:
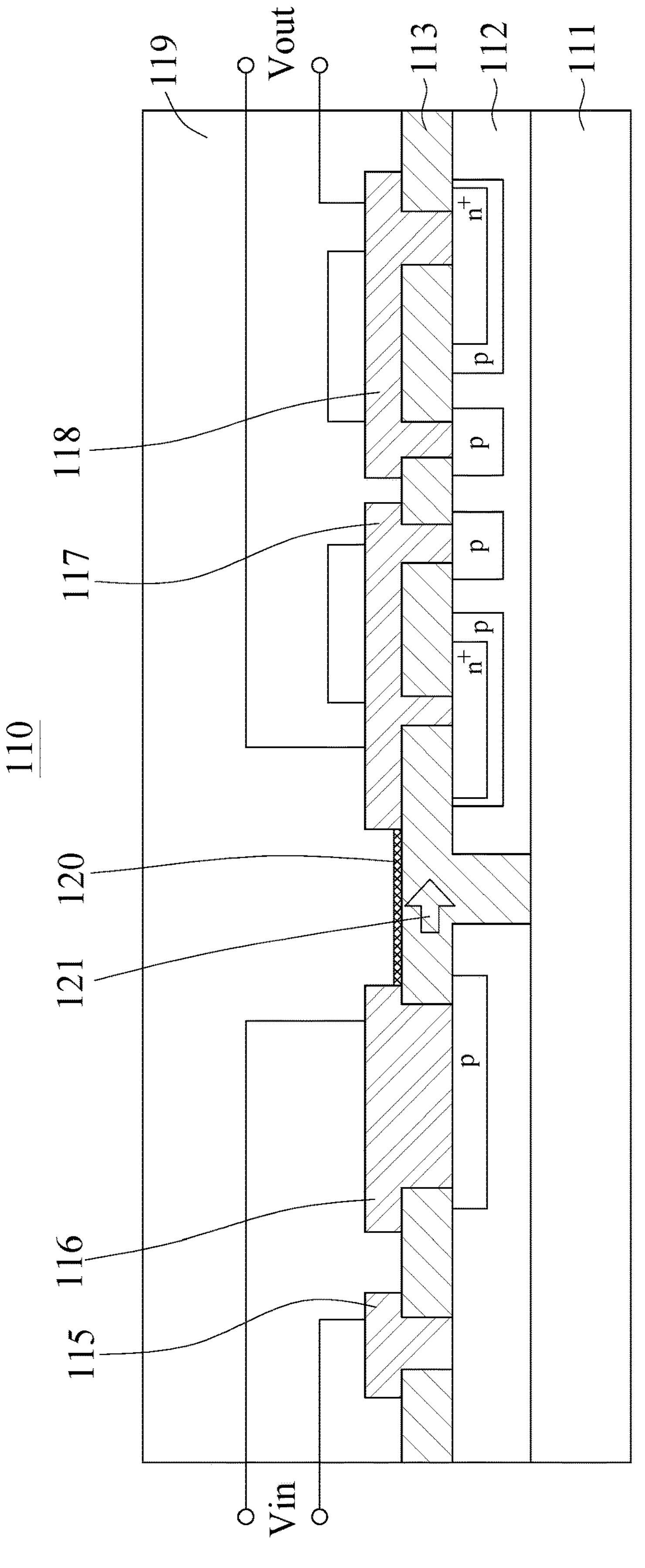
FIG. 11 shows a schematic view of a cross-sectional structure of the fourth embodiment of the SiC opto-thyristor proposed in the present disclosure.

FIG. 11 shows another embodiment of a SiC opto-thyristor 110. The main structure includes a SiC substrate 111, a SiC epitaxial layer 112, an etched passivation layer 113 for forming conducting channels of a metal layer, metal conductive structures 115, 116, 117, 118 formed by a patterning process, structures defining a SiC light emitter and the SiC light-sensitive thyristor, and terminals of the input voltage Vin and the output voltage Vout formed by wire bonding. Besides, a sealant layer 119 is provided to protect the entire SiC opto-thyristor 110.

Further, the passivation layer 113 in the SiC opto-thyristor 110 shown in this example may be made of a material that is transparent to light in a specific spectrum, such as a material that is transparent to light from blue light to ultraviolet light so that the light emitted by the SiC light emitter can travel in the passivation layer 113, as shown by the arrow 121 in the figure. Further, a reflective layer 120 may be provided on a specific region of the upper surface of the passivation layer 113, where the light travels, to reflect the light traveling therein and increase light transmission efficiency.

To sum up, according to the SiC opto-thyristor and the manufacturing method described in the above embodiments, in the SiC opto-thyristor structure, the light-emitting and light-receiving devices required for the opto-thyristor are formed on the same SiC substrate. In addition to effectively simplifying the process, the light-receiving device can greatly increase the withstand voltage of the AC switch to several thousand volts without the need for additional devices, thereby achieving the purpose of reducing the chip area and module cost.

The above disclosure is only a preferred feasible embodiment of the present invention, and is not intended to limit the scope of the patent application of the present invention. Therefore, any equivalent technical changes made by utilizing the contents of the specification and drawings of the present invention are included within the scope of the claims of the present application.

What is claimed is:

1. A silicon carbide (SiC) opto-thyristor, comprising:

a SiC substrate;

a SiC light emitter formed on the SiC substrate;

a SiC light-sensitive thyristor formed on the SiC substrate, wherein a dielectric material is provided between the SiC light emitter and the SiC light-sensitive thyristor, the SiC light emitter has a terminal of an input voltage formed by wire bonding, and the SiC light-sensitive thyristor has a terminal of an output voltage by wire bonding; and a reflective layer for a spectrum between blue light and ultraviolet light formed any side of an interior of the SiC opto-thyristor by coating to increase photosensitivity of the interior of the SiC opto-thyristor;

wherein the SiC opto-thyristor is manufactured by a method comprising the steps of:

providing the SiC substrate;

performing an epitaxial process to form an N-type epitaxial layer on the SiC substrate;

forming a structure doped with a P-type semiconductor material by implanting the P-type semiconductor material at multiple positions on the N-type epitaxial layer, wherein a part of P/N junctions formed by P-type dopant and N-type epitaxy constitutes the SiC light emitter;

implanting an N-type semiconductor material in a part of a structure implanted with the P-type semiconductor material to form one or more P/N junctions and define a region of a basic structure for forming the SiC light-sensitive thyristor;

forming conducting channels in a passivation layer for the SiC light emitter and the SiC light-sensitive thyristor on the N-type epitaxial layer and positions doped with P-type semiconductor material and/or the N-type semiconductor material by an etching process after depositing the passivation layer;

forming a structure of electrical contacts of the SiC light emitter and the SiC light-sensitive thyristor by a patterning process after forming a metal conductor layer;

forming the terminals of the input voltage and the output voltage of the SiC opto-thyristor by wire bonding on the electrical contacts of the SiC light emitter and the SiC light-sensitive thyristor; and performing a packaging process.

2. The SiC opto-thyristor of claim 1, wherein the light emitted by the SiC light emitter travels through a structure of the SiC opto-thyristor having a sealant material or being not filled with the sealant material and toward the SiC light-sensitive thyristor after being reflected by the reflective layer, thereby generating a gate current in the SiC light-sensitive thyristor.

3. The SiC opto-thyristor of claim 1, wherein the passivation layer is made of a transparent passivation layer material for a spectrum between blue light and ultraviolet light so that light emitted by the SiC light emitter travels through an interior of the passivation layer toward the SiC light-sensitive thyristor.

4. The SiC opto-thyristor of claim 1, wherein in the packaging process, a sealant material is used to seal the SiC light emitter, the SiC light-sensitive thyristor and other semiconductor devices to form a sealant layer, and the sealant material is a transparent material for a spectrum between blue light and ultraviolet light.

5. The SiC opto-thyristor of claim 4, wherein the reflective layer is formed on an upper surface of the sealant layer or a cavity structure corresponding to the SiC light emitter and the structure of the SiC light-sensitive thyristor.

6. The SiC opto-thyristor of claim 1, wherein the reflective layer is formed on one or more regions of an upper surface of the passivation layer by coating.

* * * * *